US008956977B2

(12) United States Patent
Ono et al.

(10) Patent No.: US 8,956,977 B2
(45) Date of Patent: Feb. 17, 2015

(54) SEMICONDUCTOR DEVICE PRODUCTION METHOD AND RINSE

(75) Inventors: Shoko Ono, Ichihara (JP); Kazuo Kohmura, Iwakuni (JP); Hirofumi Tanaka, Sodegaura (JP)

(73) Assignee: Mitsu Chemicals, Inc., Minato-Ku, Tokyo (JP)

( * ) Notice: Subject to any disclaimer, the term of this patent is extended or adjusted under 35 U.S.C. 154(b) by 0 days.

(21) Appl. No.: 13/818,347

(22) PCT Filed: Sep. 8, 2011

(86) PCT No.: PCT/JP2011/070516
§ 371 (c)(1),
(2), (4) Date: Feb. 22, 2013

(87) PCT Pub. No.: WO2012/033172
PCT Pub. Date: Mar. 15, 2012

(65) Prior Publication Data
US 2013/0171826 A1    Jul. 4, 2013

(30) Foreign Application Priority Data

Sep. 10, 2010  (JP) ................................. 2010-203068
Nov. 26, 2010  (JP) ................................. 2010-263882

(51) Int. Cl.
*H01L 21/311*   (2006.01)
*H01L 21/02*    (2006.01)
*H01L 21/3105*  (2006.01)
*H01L 21/768*   (2006.01)
*H01L 23/532*   (2006.01)

(52) U.S. Cl.
CPC .... *H01L 21/02334* (2013.01); *H01L 21/02063* (2013.01); *H01L 21/0209* (2013.01); *H01L 21/3105* (2013.01); *H01L 21/76831* (2013.01); *H01L 23/5329* (2013.01); *H01L 23/53295* (2013.01); *H01L 21/02087* (2013.01); *H01L 21/76826* (2013.01); *H01L 21/02203* (2013.01)
USPC ............ 438/694; 216/86; 438/745; 252/79.1; 252/79.2

(58) Field of Classification Search
CPC .................. H01L 21/02052; H01L 21/02334; H01L 21/32134; H01L 21/76814; H01L 21/3105; H01L 21/76831; C11D 11/0047; C09K 13/0004
See application file for complete search history.

(56) References Cited

U.S. PATENT DOCUMENTS

| 5,814,157 A * | 9/1998 | Mizuniwa et al. ............. 134/1.2 |
| 2005/0245080 A1 | 11/2005 | Wang et al. |
| 2006/0084277 A1 * | 4/2006 | Nakashima et al. .......... 438/758 |
| 2008/0000776 A1 | 1/2008 | Wang et al. |
| 2008/0274627 A1 * | 11/2008 | Hamada et al. ............... 438/787 |
| 2008/0311752 A1 | 12/2008 | Sharma |
| 2009/0014846 A1 * | 1/2009 | Fresco et al. .................. 257/642 |
| 2010/0105154 A1 | 4/2010 | Wang et al. |
| 2011/0020955 A1 * | 1/2011 | DeYoung ......................... 438/4 |

FOREIGN PATENT DOCUMENTS

| JP | 2005-206905 A | | 8/2005 | |
| JP | 2006-352042 A | | 12/2006 | |
| JP | 2009-503879 A | | 1/2009 | |
| JP | 2009-105299 | * | 5/2009 | ............ H01L 21/304 |
| JP | 2009-105299 A | | 5/2009 | |
| JP | 2010-070726 A | | 4/2010 | |
| WO | WO 2009/012184 A1 | | 1/2009 | |
| WO | WO 2009/085098 A1 | | 7/2009 | |

OTHER PUBLICATIONS

International Search Report (PCT/ISA/210) issued on Oct. 25, 2011, by the Japanese Patent Office as the International Searching Authority for International Application No. PCT/JP2011/070516.
Written Opinion (PCT/ISA/237) issued on Oct. 25, 2011, by the Japanese Patent Office as the International Searching Authority for International Application No. PCT/JP2011/070516.
Extended Search Report issued in corresponding European application No. 11823646.2 on Dec. 2, 2014.
K.L. Chavez et al., "A Novel Method of Etching Copper Oxide Using Acetic Acid," Journal of the Electrochemical Society, vol. 148, No. 11, Jan. 1, 2011, p. G640-G643.

* cited by examiner

*Primary Examiner* — Lan Vinh
*Assistant Examiner* — Jiong-Ping Lu
(74) *Attorney, Agent, or Firm* — Buchanan, Ingersoll & Rooney PC

(57) ABSTRACT

The present invention provides a semiconductor device production method and a rinse used in the production method. The method includes: a sealing composition application process in which a semiconductor sealing layer is formed by applying, to at least a portion of a surface of a semiconductor substrate, a semiconductor sealing composition that includes a resin having a cationic functional group and a weight average molecular weight of from 2,000 to 600,000, wherein a content of sodium and a content of potassium are 10 mass ppb or less on an elemental basis, respectively; and, subsequently, a rinsing process in which the surface of the semiconductor substrate on which the semiconductor sealing layer has been formed is rinsed with a rinse having a pH at 25° C. of 6 or lower.

12 Claims, No Drawings

SEMICONDUCTOR DEVICE PRODUCTION METHOD AND RINSE

TECHNICAL FIELD

The present invention relates to a semiconductor device production method, and a rinse.

BACKGROUND ART

In the field of semiconductor devices, with a trend of miniaturization, various investigations have been made on materials with a low dielectric constant (hereinafter, also referred to as "low-k materials") that have a porous structure, as an interlayer dielectric layer of a semiconductor.

In a semiconductor interlayer dielectric layer having a porous structure, when the void fraction thereof is increased in order to further lower the dielectric constant, a metal component such as copper, which is embedded as a wiring material, may readily enter the fine pores of the semiconductor interlayer dielectric layer, thereby increasing the dielectric constant or generating a leak current.

On the other hand, in the semiconductor device production method by using a porous, low dielectric constant material, a technique of sealing fine pores on side walls of grooves that have been formed by etching, using a micelle-type surfactant in wet washing after the etching, has been known (see, for example, Patent Document 1).

Further, when the low-k material has a hydrophobic surface, a technique of controlling the hydrophilicity or hydrophobicity of the material by applying a polyvinyl alcohol-based amphipathic polymer to its surface has been known (see, for example, Patent Document 2).

Moreover, a composition for polishing a semiconductor, which includes a cationic polymer and a surfactant, has been known (see, for example, Patent Document 3).

In the method for manufacturing a semiconductor device by using a porous, low dielectric constant material, at the time of sealing fine pores on side walls or the like of grooves that have been formed by etching, if there is a wiring line formed from copper or the like on the surface of the substrate together with a porous interlayer dielectric layer, the material used for sealing (sealing composition) may adhere to the wiring line. Such an extra sealing composition needs to be removed, since it may cause circuit malfunction or corrosion of a semiconductor device. As such, there has been a demand for a method (hereinafter, also referred to as a "rinsing method") of rapidly removing the extra sealing composition on the wiring line, while leaving the material that seals the fine pores, and a rinse (hereinafter, also referred to as a "cleaning agent").

Further, an extra material that does not form a constituent element of a semiconductor circuit, which exists on the peripheral area of the surface of a semiconductor substrate on which a circuit is not formed or at the back face of the semiconductor substrate on which the dielectric film is not formed, and the like, may exfoliate during the process of manufacturing the semiconductor, and may contaminate the semiconductor substrate. Therefore, the extra material needs to be removed by a method such as back rinsing or edge rinsing. Accordingly, there has been a demand for a method of rapidly removing the film that is formed on a semiconductor device.

[Patent Document 1] Japanese National Phase Publication No. 2009-503879
[Patent Document 2] WO 09/012184, Pamphlet
[Patent Document 3] Japanese Patent Application Laid-Open (JP-A) No. 2006-352042

DISCLOSURE OF INVENTION

Technical Problem

However, in the technique described in Patent Document 1, the surfactant not having a micelle structure may enter the fine pores on the side walls of grooves, thereby increasing the dielectric constant. Further, adhesion between the interlayer dielectric layer and the wiring material may be lowered due to the micelles.

Further, in the technique described in Patent Document 2, a bulky layer may readily be formed due to hydrogen bonding between the polyvinyl alcohol-based amphipathic polymers. As a result, an increase in the dielectric constant or a decrease in the adhesion between the interlayer dielectric layer and the wiring material may be caused.

Further, there may be cases in which the extra sealing composition adhering to the wiring line cannot be removed rapidly while maintaining the effective material that seals the porous interlayer dielectric layer, whereby the production efficiency may be lowered.

In addition, there may be cases in which the extra material adhering to the peripheral area, the back face or the like of the semiconductor substrate cannot be removed rapidly, whereby the production efficiency may be lowered.

An object of the present invention is to provide a semiconductor device production method, in which a semiconductor sealing composition that can form a thin sealing layer and has an excellent covering property with respect to fine pores of a porous interlayer dielectric layer is used, and the sealing composition that remains on a wiring line or at a peripheral area or a back face of a semiconductor substrate is readily removed, whereby contamination caused by the extra semiconductor sealing composition that exists at a wiring portion or at the peripheral area or the back face of the semiconductor substrate is suppressed.

Another object of the present invention is to provide a rinse that is used in the semiconductor device production method.

Means for Solving the Problem

The present inventors have made intensive investigations and, as a result, have found that the problem can be solved by a production method in which a semiconductor sealing composition that includes a specific resin and a specific rinse are used. Namely, the present invention provides the following means.

<1> A semiconductor device production method, the method comprising:

a sealing composition application process in which a semiconductor sealing layer is formed by applying, to at least a portion of a surface of a semiconductor substrate, a semiconductor sealing composition that includes a resin having a cationic functional group and a weight average molecular weight of from 2,000 to 600,000, wherein a content of sodium and a content of potassium are 10 mass ppb or less on an elemental basis, respectively; and, subsequently, a rinsing process in which the surface of the semiconductor substrate on which the semiconductor sealing layer has been formed is rinsed with a rinse having a pH at 25° C. of 6 or lower.

<2> The semiconductor device production method according to <1>, wherein the resin having a cationic functional group and a weight average molecular weight of from 2,000 to 600,000 has a cationic functional group equivalent amount of from 43 to 430.

<3> The semiconductor device production method according to <1> or <2>, wherein the resin having a cationic functional group and a weight average molecular weight of from 2,000 to 600,000 is polyethyleneimine or a polyethyleneimine derivative.

<4> The semiconductor device production method according to any one of <1> to <3>, wherein a porous interlayer dielectric layer is formed on at least a portion of the surface of the semiconductor substrate.

<5> The semiconductor device production method according to <4>, wherein the semiconductor sealing layer is formed on the porous interlayer dielectric layer, the porous interlayer dielectric layer has a concave groove having a width of from 10 nm to 32 nm, and the sealing composition application process includes contacting the semiconductor sealing composition to at least a side face of the concave groove of the porous interlayer dielectric layer.

<6> The semiconductor device production method according to <4> or <5>, wherein the porous interlayer dielectric layer contains porous silica, and has a silanol residue derived from the porous silica on a surface of the porous interlayer dielectric layer.

<7> The semiconductor device production method according to any one of <1> to <6>, wherein the rinse includes at least one solvent selected from the group consisting of water, methanol, ethanol, propanol, butanol and propylene glycol monomethyl ether acetate.

<8> The semiconductor device production method according to any one of <1> to <7>, wherein the rinse includes at least one acid selected from the group consisting of oxalic acid, formic acid, citric acid, p-toluenesulfonic acid, methanesulfonic acid, hydrochloric acid and nitric acid.

<9> The semiconductor device production method according to any one of <1> to <8>, wherein the surface of the semiconductor substrate on which the semiconductor sealing layer has been formed comprises a surface on which a semiconductor circuit is not formed.

<10> The semiconductor device production method according to claim <9>, wherein the rinse, with which the surface on which a semiconductor circuit is not formed is rinsed, has a pH at 25° C. of 2 or lower.

<11> The semiconductor device production method according to any one of <1> to <8>, wherein at least a portion of the surface of the semiconductor substrate comprises a circuit face that is provided with a porous interlayer dielectric layer and a wiring material that includes copper, and the rinsing process is a circuit face rinsing process in which the sealing layer on the wiring material is removed.

<12> The semiconductor device production method according to <11>, wherein the rinse with which the semiconductor circuit face is rinsed has a pH at 25° C. of 1 or higher.

<13> The semiconductor device production method according to any one of <1> to <12>, wherein the cationic functional group is at least one selected from the group consisting of a primary amino group and a secondary amino group.

<14> The semiconductor device production method according to any one of <1> to <13>, further comprises a surface peripheral area rinsing process in which a peripheral area of the surface of the semiconductor substrate on which the semiconductor sealing layer has been formed is rinsed by spraying the rinse.

<15> The semiconductor device production method according to any one of <1> to <14>, wherein the rinse comprises at least one resin decomposer selected from the group consisting of hydrogen peroxide and nitric acid.

<16> The semiconductor device production method according to any one of <1> to <15>, wherein the circuit face rinsing process comprises rinsing under a non-oxidizing atmosphere.

<17> The semiconductor device production method according to any one of <1> to <16>, wherein the rinse does not include an oxidative compound.

<18> The semiconductor device production method according to any one of <1> to <17>, wherein the semiconductor substrate includes a silanol residue derived from a naturally oxidized film that is formed on the surface of the substrate.

<19> A rinse for removing a semiconductor sealing layer that is derived from a resin having a cationic functional group and a weight average molecular weight of from 2,000 to 600,000, the semiconductor sealing layer being positioned on a metal wiring of a semiconductor circuit face or on a semiconductor substrate, and the rinse having a pH at 25° C. of 6 or lower.

<20> The rinse according to <19>, wherein the resin having a cationic functional group and a weight average molecular weight of from 2,000 to 600,000 has a cationic functional group equivalent amount of from 43 to 430, and the cationic functional group is at least one selected from the group consisting of a primary amino group and a secondary amino group.

<21> The rinse according to <19> or <20>, wherein the rinse has a pH at 25° C. of 1 or higher and is used for rinsing the semiconductor circuit face.

<22> The rinse according to <19> or <20>, wherein the rinse has a pH at 25° C. of 2 or lower and is used for rinsing a face of the semiconductor substrate on which the circuit is not formed.

Effects of the Invention

According to the semiconductor device production method of the present invention, it is possible to readily remove a sealing composition that can form a thin sealing layer and exhibits an excellent sealing ability with respect to fine pores of a porous interlayer insulating layer, the sealing composition being attached to a portion on a wiring or a peripheral area or a back face of the semiconductor substrate on which a circuit is not formed, while suppressing contamination of the wiring portion, peripheral portion or the back face of the semiconductor substrate with the extra semiconductor sealing composition.

DESCRIPTION OF EMBODIMENT

The semiconductor device production method of the present invention includes a sealing composition application process in which a semiconductor sealing layer is formed by applying, to at least a portion of a surface of a semiconductor substrate, a semiconductor sealing composition that includes a resin having a cationic functional group and a weight average molecular weight of from 2,000 to 600,000, wherein a content of sodium and a content of potassium are 10 mass ppb or less on an elemental basis, respectively; and, subsequently, a rinsing process in which the surface of the semiconductor substrate on which the semiconductor sealing layer has been formed is rinsed with a rinse having a pH at 25° C. of 6 or lower.

As necessary, the semiconductor device production method of the present invention further includes one or more other processes between the sealing composition application process and the rinsing process, or after the rinsing process.

The term "the face on which the semiconductor sealing composition is formed" used in the present invention includes any one of a front face of the semiconductor substrate (a circuit face provided with a porous interlayer dielectric layer and a wiring material including copper), a back face of the semiconductor substrate (a face on which a semiconductor circuit is not formed) or a peripheral area of the front face (a face on which a semiconductor circuit is formed), or a combination thereof.

1. Sealing Composition Application Process

The sealing composition application process according to the present invention includes an operation of applying, to at least a portion of a surface of a semiconductor substrate, a semiconductor sealing composition that includes a resin having a cationic functional group and has a weight average molecular weight of from 2,000 to 600,000, wherein a content of sodium and a content of potassium are 10 ppb or less on an elemental basis.

<Semiconductor Substrate>

The semiconductor substrate according to the present invention is not specifically restricted and may be any semiconductor substrate that is commonly used. Specific examples include a silicon wafer and a silicon wafer on which a circuit such as a transistor is formed.

<Porous Interlayer Dielectric Layer>

The porous interlayer dielectric layer according to the present invention is not particularly limited as far as it is made of a material having a low dielectric constant and a porous structure. Preferably, the porous interlayer dielectric layer includes porous silica and has, on its surface, a silanol residue derived from the porous silica. By the interaction between the silanol residue and the cationic functional group contained in the resin, a thin layer of the resin is formed such that the resin covers fine pores on the interlayer dielectric layer.

The porous silica according to the present invention is not specifically restricted and may be any porous silica that is generally used for an interlayer dielectric layer of a semiconductor device. Examples of the porous silica include an oxide having uniform meso-fine pores that is obtained by a method utilizing self-organization of an organic compound and an inorganic compound, which is caused by hydrothermal synthesis in a sealed heat-resistant container including silica gel, a surfactant, and the like, as described in the International Publication No. WO 91/11390; and a porous silica produced from a condensate of an alkoxy silane and a surfactant, as described in Nature, 1996, vol. 379 (page 703) or Supramolecular Science, 1998, vol. 5 (page 247 etc.)

In particular, an interlayer dielectric layer formed from the porous silica described in WO 2009/123104 is preferable.

The porous interlayer dielectric layer can be formed, for example, by coating a surface of a silicon wafer with the composition for forming porous silica as described above, and subjecting the same to a heat treatment or the like, as necessary.

The porous interlayer dielectric layer according to the invention may have a concave groove having a width of from 10 nm to 32 nm. The concave groove is formed mainly for the purpose of embedding a wiring material therein, and may be formed by a common etching process for a semiconductor. The term "side face of a concave groove" refers to a face that is formed so as to be substantially orthogonal with respect to a plane that is parallel to the substrate. Further, the porous interlayer dielectric layer may have a pore that reaches a wiring line or the like that is directly formed on the silicon wafer.

As described below, by contacting the semiconductor sealing composition to the concave groove, diffusion of a component included in the wiring material into pores of the porous interlayer dielectric layer can be effectively suppressed while embedding the wiring material into the concave groove.

The process of forming a concave groove having a width of from 10 nm to 32 mu or a pore in the interlayer dielectric layer can be carried out in accordance with the process conditions that are common for manufacturing semiconductor devices. For example, a groove having a desired pattern may be formed by forming a hard mask and a photoresist on the interlayer dielectric layer, and carrying out etching according to a pattern of the photoresist. Further, as described above, when the porous interlayer dielectric layer includes porous silica, surfaces of the porous silica are scraped during the formation of the concave groove. As a result, the density of silanol groups at the surface tends to be increased.

<Wiring Formation Process>

A circuit is formed by depositing a wiring material that contains copper between elements such as a transistor formed on the silicon wafer. The wiring formation process can be carried out according to known process conditions. For example, a copper wiring line is formed directly on a silicon wafer, or on an interlayer dielectric layer having a concave groove or a pore as described above, by a metal CVD method, a sputtering method or an electroplating method, and then the film is smoothed by chemical mechanical polishing (CMP). As necessary, a multilayer structure can be obtained by forming a cap film on the surface of the film and forming a hard mask thereon, and repeating the process of forming a porous interlayer dielectric layer and the process of forming a wiring line.

<Semiconductor Sealing Composition>

The semiconductor sealing composition according to the present invention is used, for example, to form a resin layer that covers fine pores formed on the porous interlayer dielectric layer. The semiconductor sealing composition includes at least one resin having a cationic functional group and a weight average molecular weight of from 2000 to 600000. The content of sodium and the content of potassium in the semiconductor sealing composition are 10 ppb or less on an elemental basis, respectively. Preferably, the semiconductor sealing composition has a volume average particle diameter measured by a dynamic light scattering method of 10 nm or less.

When a semiconductor sealing composition having the composition as specified above is applied onto a porous interlayer dielectric layer having a porous structure, for example, the cationic functional group of the resin is adsorbed to the interlayer dielectric layer at multiple points, whereby the fine pores that exist at a surface of the interlayer dielectric layer are covered with a resin layer. As a result, diffusion of a metal component into the porous interlayer dielectric layer can be suppressed. Further, since the resin layer formed from the resin is a thin layer (for example, 5 nm or less), adhesion between the interlayer dielectric layer and the wiring material, which is formed on the interlayer dielectric layer via the resin layer, is excellent, and the change in dielectric constant can be suppressed.

[Resin]

The semiconductor sealing composition according to the present invention includes at least one resin having a cationic functional group and a weight average molecular weight of from 2,000 to 600,000.

The resin has at least one kind of cationic functional group, but the resin may further have an anionic functional group or a nonionic functional group, as necessary. Further, the resin may have a repeating unit structure having a cationic functional group, or may have a random structure formed from a monomer that constitutes the resin that polymerizes in a branched form, rather than a specific repeating unit structure. In the present invention, from the viewpoint of suppressing diffusion of a metal component, the resin preferably has a random structure formed from a monomer that constitutes the resin that polymerizes in a branched form, rather than a specific repeating unit structure.

The cationic functional group is not particularly limited as far as it is a functional group that can be positively charged. Examples of the cationic functional group include an amino group and a quaternary ammonium group. Among them, from the viewpoint of suppressing diffusion of a metal component, the cationic functional group is preferably at least one selected from the group consisting of a primary amino group and a secondary amino group.

The nonionic functional group may be a hydrogen bond-accepting group or may be a hydrogen bond-donating group. Examples of the nonionic functional group include a hydroxyl group, a carbonyl group and an ether group.

The anionic functional group is not particularly limited as far as it is a functional group that can be negatively charged. Examples of the cationic functional group include a carboxyl group, a sulfonic acid group, and a sulfate group.

Since the resin has a cationic functional group in a molecule, the resin can suppress diffusion of a metal component. Further, from the viewpoint of suppressing diffusion of a metal component, the resin preferably has a high cation density. Specifically, the cationic functional group equivalent weight of the resin is preferably from 43 to 430, more preferably from 200 to 400.

When the surface of the porous interlayer dielectric layer is subjected to a hydrophobication treatment by a known method, for example, by a method described in WO 04/026765, WO 06/025501 and the like, the density of polar groups at the surface is decreased. Therefore, a cationic functional group equivalent weight of from 200 to 400 is also preferred.

In the specification, the term "cationic functional group equivalent weight" refers to a weight average molecular weight per cationic functional group, and is a value (Mw/n) obtained by dividing the weight average molecular weight (Mw) of the resin by the number of cationic functional groups included in one molecule of the resin (n). The greater the cationic functional group equivalent weight is, the smaller the density of cationic functional groups is. The smaller the cationic functional group equivalent weight is, the greater the density of cationic functional groups is.

When the resin used in the present invention has a repeating unit structure having a cationic functional group (hereinafter, also referred to as a "specific unit structure"), the cationic functional group may be included in the specific unit structure as at least a portion of a main chain, or may be included as at least a portion of a side chain, or may be included as at least a portion of a main chain and at least a portion of a side chain.

When the specific unit structure includes two or more cationic functional groups, the two or more cationic functional groups may be the same or different from each other.

Further, it is preferable that the cationic functional group is incorporated such that the ratio of the length of a main chain of a specific unit structure with respect to the average distance between absorption points of cationic functional groups (for example, silanol residues) that exist on the porous interlayer dielectric layer (hereinafter, also referred to as a "relative distance between cationic functional groups) is from 0.08 to 1.2, more preferably from 0.08 to 0.6. In that case, the resin tends to adsorb at multiple points to the porous interlayer dielectric layer more efficiently.

In the present invention, from the viewpoint of adsorptivity with respect to the interlayer dielectric layer, the specific unit structure preferably has a molecular weight of from 30 to 500, more preferably from 40 to 200. The molecular weight of the specific unit structure refers to the molecular weight of a monomer that constitutes the specific unit structure.

From the viewpoint of adsorptivity with respect to the interlayer dielectric layer, the specific unit structure in the present invention preferably has a relative distance between cationic functional groups of from 0.08 to 1.2 and a molecular weight of from 30 to 500, and more preferably has a relative distance between cationic functional groups of from 0.08 to 0.6 and a molecular weight of from 40 to 200.

In the present invention, specific examples of the specific unit structure that includes a cationic functional group include a unit structure derived from ethyleneimine, a unit structure derived from allylamine, a unit structure derived from a diallyldimethyl ammonium salt, a unit structure derived from vinylpyridine, a unit structure derived from lysine, a unit structure derived from methylvinylpyridine, and a unit structure derived from p-vinylpyridine. Among them, from the viewpoint of adsorptivity with respect to the interlayer dielectric layer, at least one selected from the group consisting of a unit structure derived from ethyleneimine and a unit structure derived from allylamine is preferable.

The resin may further include at least one selected from the group consisting of a unit structure that includes a nonionic functional group and a unit structure that includes an anionic functional group.

Specific examples of the unit structure that includes a nonionic functional group include a unit structure derived from vinyl alcohol, a unit structure derived from alkylene oxide, and a unit structure derived from vinyl pyrrolidone.

Specific examples of the unit structure that includes an anionic functional group include a unit structure derived from styrenesulfonic acid, a unit structure derived from vinylsulfuric acid, a unit structure derived from acrylic acid, a unit structure derived from methacrylic acid, a unit structure derived from maleic acid, and a unit structure derived from fumaric acid.

In the present invention, when the resin includes two or more kinds of specific unit structures, the difference of the specific unit structures may be any of the kind or the number of polar groups included therein, the molecular weight, or the like. Further, the two or more kinds of specific unit structures may be included in the form of a block copolymer or a random copolymer.

The resin may further contain at least one kind of repeating unit structure other than the specific unit structure described above (hereinafter, also referred to as a "second unit structure"). When the resin includes a second unit structure, the specific unit structure and the second unit structure may be included in the form of a block copolymer or a random copolymer.

The second unit structure is not particularly limited as far as the unit structure is derived from a monomer that can polymerize with a monomer that constitutes the specific unit structure. Examples of the second unit structure include a unit structure derived from an olefin.

When the resin in the present invention does not have a specific repeating unit structure but has a random structure formed from a monomer that constitutes the resin that polymerizes in a branched manner, the cationic functional group may be included as at least a portion of a main chain, at least a portion of a side chain, or at least a portion of a main chain and at least a portion of a side chain.

Examples of the monomer that can constitute such a resin include ethyleneimine and derivatives thereof.

Specific examples of the resin that includes a cationic functional group in the present invention include polyethyleneimine (PEI), polyallylamine (PAA), polydiallyldimethylammonium (PDDA), polyvinylpyridine (PVP), polylysine, polymethylpyridylvinyl (PMPyV), protonated poly(p-pyridyl vinylene) (R-PHPyV), and derivatives thereof. Among them, polyethyleneimine (PEI) or a derivative thereof, polyallylamine (PAA) and the like are preferable, and polyethyleneimine (PEI) or a derivative thereof is more preferable.

Polyethyleneimine (PEI) can be produced by polymerizing ethyleneimine according to a method that is commonly used. The polymerization catalyst, the polymerization conditions, and the like may also be selected as appropriate from those generally used in the polymerization of ethyleneimine Specifically, for example, the reaction can be conducted in the presence of an effective amount of an acid catalyst, such as hydrochloric acid, at a temperature of from 0° C. to 200° C. Further, ethyleneimine may be subjected to addition polymerization with polyethyleneimine as the basis. Moreover, the polyethyleneimine in the present invention may be a homopolymer of ethyleneimine, or may be a copolymer of ethyleneimine and a compound that can copolymerize with ethyleneimine, such as an amine. With regard to a method for producing polyethyleneimine, for example, Japanese Patent Application Publication (JP-B) Nos. 43-8828 and 49-33120 and the like may be referred to.

Further, the polyethyleneimine in the present invention may be obtained by using crude ethyleneimine that is obtained from monoethanol amine. With regard to the specific examples of such polyethyleneimine, for example, JP-A No. 2001-2123958 and the like may be referred to.

The polyethyleneimine, produced by a process as described above, has a complicated structure having not only a partial structure in which ethyleneimine is ring-opened and connected to form a straight chain, but also a partial structure in which the ethyleneimine is connected to form a branched chain, a partial structure in which the straight-chain partial structures are connected by crosslinking, and the like. By using a resin having a cationic functional group of a structure as described above, multipoint adsorption of the resin can be more efficient. Further, a sealing layer may be formed more effectively via interaction among the resin.

A polyethyleneimine derivative is also suitably used. The polyethyleneimine derivative is not particularly limited as far as it can be produced from polyethyleneimine. Specific examples of the polyethyleneimine derivative include a polyethyleneimine derivative obtained by introducing an alkyl group (preferably having from 1 to 10 carbon atoms) or an aryl group into polyethyleneimine, and a polyethyleneimine derivative obtained by introducing a crosslinkable group, such as a hydroxyl group, into polyethyleneimine.

The polyethyleneimine derivatives can be produced by an ordinary method from polyethyleneimine. Specifically, for example, the polyethyleneimine derivatives can be produced by a method described in JP-A No. 6-016809 and the like.

The polyethyleneimine or a derivative thereof in the present invention may be a commercially available product. For example, polyethyleneimine and derivatives thereof available from Nippon Shokubai Co., Ltd., BASF and the like may be selected and used.

The weight average molecular weight of the resin in the present invention is from 2,000 to 600,000, preferably from 2,000 to 300,000, more preferably from 2,000 to 100,000, yet more preferably from 10,000 to 80,000, and yet more preferably from 20,000 to 60,000. That the weight average molecular weight is from 2,000 to 600,000 means that the molecular weight is adjusted to fall within this range, in view of sealing of fine pores of the porous interlayer dielectric layer and the dielectric constant.

For example, when the semiconductor sealing composition according to the invention is applied to production of a semiconductor device in which the wiring interval is 32 nm or less and the diameter of fine pores on the interlayer dielectric layer is approximately 2 nm, and the weight average molecular weight of the resin is more than 600,000, the size of the resin is greater than the wiring interval and the resin is prevented from entering the concave groove in which the wiring material is to be embedded, whereby the fine pores of side faces of the groove are not sufficiently covered. When the weight average molecular weight of the resin is less than 2,000, the size of the resin molecule is smaller than the diameter of fine pores on the interlayer dielectric layer and the resin molecule enters the fine pores on the interlayer dielectric layer, whereby the dielectric constant of the interlayer dielectric layer is increased. Further, the adsorption of the resin may not occur at multi points.

The weight average molecular weight is measured with a GPC equipment that is commonly used for measuring the molecular weight of a resin. The weight average molecular weight described in the specification is measured under the following conditions.

GPC equipment: GPC-101, manufactured by Shodex Co., Ltd.
Column: ASAHIPAK GF-7M HQ
Eluent: 0.5 M $NaNO_3$+0.5 M AcOH solution
Flow rate: 1 mL/min.

It is also preferable that the resin has a critical micelle concentration in an aqueous solvent of 1% by mass or more, or that the resin is a resin that does not substantially form a micelle structure. The expression "does not substantially form a micelle structure" as used herein refers to that a micelle is not formed under general conditions, such as in an aqueous solvent at an ordinary temperature, i.e., the critical micelle concentration cannot be measured. With such a resin, a thin resin layer having a thickness of a molecule level (for example, 5 nm or less) can be formed, and an increase in the dielectric constant of the interlayer dielectric layer can be effectively suppressed. Further, adhesion between the interlayer dielectric layer and the wiring material may be enhanced more effectively.

Moreover, the resin in the present invention is preferably a polyethyleneimine having a weight average molecular weight of from 2,000 to 600,000 and has a cationic functional group equivalent weight of from 43 to 430, and more preferably a polyethyleneimine having a weight average molecular weight of from 10,000 to 80,000 and has a cationic functional group equivalent weight of from 200 to 400. In accordance with the embodiment as described above, diffusion of a metal component into the interlayer dielectric layer may be suppressed more effectively, and adhesion between the interlayer dielectric layer and the wiring material may be further enhanced.

The content of the resin in the semiconductor sealing composition according to the invention is not particularly limited, and the content of the resin may be, for example, from 0.01% by mass to 1.0% by mass, preferably from 0.02% by mass to 0.3% by mass. Further, the content of the resin in the composition can be adjusted based on the area and the fine pore density of the plane on which a resin layer is to be formed with the semiconductor sealing composition according to the invention.

In the semiconductor sealing composition according to the invention, the content of sodium and the content of potassium are 10 ppb or less on an elemental basis, respectively. The term "10 ppb or less" refers to that sodium and potassium are not positively contained. When the content of sodium or potassium exceeds 10 ppb on an elemental basis, a leak current may be generated.

The semiconductor sealing composition according to the invention may include a solvent in addition to the resin, as necessary, and a solvent is contained at least in the sealing composition application process. The solvent in the present invention is not particularly limited as far as it uniformly dissolves the resin, and is difficult to form a micelle. Examples of such solvents include water (preferably, ultrapure water) and water-soluble organic solvents (for example, alcohols). In the present invention, from the viewpoint of micelle formability, water or a mixture of water and a water-soluble organic solvent is preferably used as the solvent.

The boiling point of the solvent is not particularly limited, but the boiling point is preferably 210° C. or lower, more preferably 160° C. or lower. When the boiling point of the solvent is within the above range, for example, in a case in which a rinsing process or a drying process is provided after the process of applying the semiconductor sealing composition according to the present invention to the interlayer dielectric layer, as described below, the solvent can be removed without significantly affecting the insulating properties of the interlayer dielectric layer, or at a low temperature that does not cause exfoliation of the sealing composition from the interlayer dielectric layer, thereby forming a semiconductor sealing layer. The term "semiconductor sealing composition" is used also to refer to a sealing composition that forms these semiconductor sealing layers.

Moreover, the semiconductor sealing composition according to the invention may further contain, as necessary, cations such as cesium ions as long as the effect of the invention is not impaired. When the sealing composition includes cations of cesium or the like, it becomes easier for the resin in the semiconductor sealing composition to spread over the interlayer dielectric layer more uniformly.

Further, it is preferable that the semiconductor sealing composition according to the invention is not added with a compound that decomposes or dissolves the interlayer dielectric layer. Specifically, for example, especially in a case in which the main material of the interlayer dielectric layer is an inorganic compound such as silica, when a fluorine-containing compound or the like is incorporated in the composition according to the invention, there may be a case in which the interlayer dielectric layer is dissolved and its insulating property is impaired, thereby causing an increase in the dielectric constant.

It is preferable that the semiconductor sealing composition according to the invention contains only compounds that have a boiling point of 210° C. or lower, preferably 160° C. or lower, or compounds that do not exhibit decomposability even when heated up to 250° C.

The expression "compounds that do not exhibit decomposability even when heated up to 250° C." refers to compounds having a change in mass after being maintained at 250° C. under nitrogen for one hour, with respect to the mass measured at 25° C., of less than 50%.

It is preferable that the semiconductor sealing composition according to the invention preferably has a volume average particle diameter as measured by a dynamic light scattering method of 10 nm or less. The expression "having a volume average particle diameter of 10 nm or less" refers to that large particles are not positively contained in view of adhesion. When the volume average particle diameter exceeds 10 nm, there may be a case in which adhesion with respect to the wiring material is lowered, or diffusion of a metal component into the interlayer dielectric layer is not sufficiently suppressed.

In the present invention, the volume average particle diameter can be measured using ELSZ-2, manufactured by Ootsuka Denshi Co., Ltd., at a temperature of from 23° C. to 26° C., in accordance with a dynamic light scattering method (a method for analyzing the time-dependent fluctuation in scattering light observed by the dynamic light scattering method, using photon correlation, for example, under the conditions of a cumulative number of 70, a number of repetition of 1, and the like).

In the present invention, the case in which the volume average particle diameter exceeds 10 nm refers to, specifically, a case in which a micelle (having an average particle diameter of 10 nm or more) is formed in the composition, or a case in which abrasive particles of a metal oxide, which are used for polishing (chemical mechanical polishing) copper to form wiring lines or the like, are included in the composition, or the like.

When a micelle having a large particle diameter is formed in the semiconductor sealing composition, for example, in a case of applying the semiconductor sealing composition according to the invention to the manufacture of a semiconductor device having a wiring interval of 32 nm of less, there is a case in which the resin that constitutes the semiconductor sealing composition cannot sufficiently enter concave grooves in which the wiring material is to be embedded. As a result, fine pores at side faces of the grooves may not be sufficiently sealed.

The pH of the semiconductor sealing composition according to the invention is not particularly limited, but it is preferably equal to or higher than the isoelectric point of the interlayer dielectric layer, from the viewpoint of the adsorptivity of the resin with respect to the interlayer dielectric layer. Further, in a case in which the resin has a cationic functional group as a polar group, the pH of the semiconductor sealing composition is preferably within a range of the pH in which the cationic functional group is in a state of a cation. When the semiconductor sealing composition has a pH as specified above, the resin may adsorb to the interlayer dielectric layer more efficiently, due to the electrostatic interaction between the interlayer dielectric layer and the resin.

The isoelectric point of the interlayer dielectric layer is an isoelectric point of the compound that constitutes the interlayer dielectric layer. For example, when the compound that constitutes the interlayer dielectric layer is porous silica, the isoelectric point is around pH 2 (at 25° C.).

The "range of pH in which the cationic functional group is in a state of a cation" refers to that the pH of the semiconductor sealing composition is equal to or lower than the pKb of the resin that includes the cationic functional group. For example, when the resin that includes a cationic functional group is polyallylamine, the pKb is from 8 to 9, and when the resin that includes a cationic functional group is polyethyleneimine, the pKb is from 7 to 11.

Namely, in the present invention, the pH of the semiconductor sealing composition can be selected as appropriate, depending on the kind of the compound that constitutes the interlayer dielectric layer and the kind of the resin. For example, the pH is preferably from 2 to 11, and preferably from 7 to 11. The pH (at 25° C.) is measured with a generally used pH meter.

<Method of Applying Sealing Composition>

The method of applying the semiconductor sealing composition according to the invention to the porous dielectric layer is not particularly limited, and a generally used method can be employed. Examples of the method include a method of contacting a semiconductor sealing composition with a porous dielectric layer by, for example, a dipping method (see, for example, U.S. Pat. No. 5,208,111), a spraying method (see, for example, Schlenoff et al., Langmuir, 16(26), 9968, 2000 or Izuquierdo et al., Langmuir, 21(16), 7558, 2005), a spin coating method (see, for example, Lee et al., Langmuir, 19(18), 7592, 2003 or J. Polymer Science, part B, polymer physics, 42, 3654, 2004), or the like.

In the semiconductor device production method of the invention, by applying the semiconductor sealing composition that includes the resin, and by appropriately drying the same by a generally used method, a thin semiconductor sealing layer of the resin can be formed on the interlayer dielectric layer. The thickness of the semiconductor sealing layer is not particularly limited, but the thickness is, for example, from 0.3 nm to 5 nm, and preferably from 0.5 nm to 2 nm.

Further, it is preferable that the concentration of the resin included in the semiconductor sealing composition used in the sealing composition application process according to the present invention is less than the critical micelle concentration of the resin. In that case, the resin can be applied to the interlayer dielectric layer in the form of a thin layer (for example, 5 nm of less, preferably 2 nm or less), and an increase in the dielectric constant can be suppressed.

Moreover, as a method of contacting the semiconductor sealing composition with the side face of a concaved groove of the interlayer dielectric layer, the above-described dipping method, spraying method, or spin coating method can be employed.

After the application of the semiconductor sealing composition, the resin may be crosslinked and polymerized.

2. Rinsing Process

The semiconductor production method according to the present invention includes a process of rinsing to remove the sealing layer, by applying a rinse having a pH of 6 or lower at 25° C., after the above-described sealing composition application process.

<Circuit Face Rinsing Process>Hereinafter, a process of removing the semiconductor sealing layer formed on the surface of the porous interlayer dielectric layer disposed on the surface of the semiconductor substrate (circuit face rinsing process), is described.

In the above-described sealing composition application process, a semiconductor sealing layer is formed on the surface of the porous interlayer dielectric layer disposed on the surface of the semiconductor substrate. Here, when a sealing composition is applied, in a case in which a porous interlayer dielectric layer and a wiring material including copper are provided on at least a portion of a surface of the semiconductor substrate, or in a case in which a sealing layer which does not effectively seal the porous interlayer dielectric layer exfoliates during the semiconductor manufacturing process such as the wiring forming process and adheres onto the wiring material, or the like, a semiconductor sealing layer may be formed on the wiring material. Accordingly, in this circuit face rinsing process, the extra semiconductor sealing composition that has adhered to the wiring material is rapidly removed by rinsing, while maintaining the effective semiconductor sealing composition that seals the porous interlayer dielectric layer.

The first rinse (cleaning agent) according to the present invention, which is used in the circuit face rinsing process, is a solution having the upper limit of the pH at 25° C. of 6 or lower, preferably 5 or lower, and the lower limit of the pH of preferably 1 or higher, more preferably 2 or higher, and more preferably from 1 to 5, yet more preferably from 2 to 5, yet more preferably from 2 to 3.

The first rinse is a liquid that dissolves or decomposes the composition in order to rapidly wash and remove the above-described extra semiconductor sealing composition (semiconductor sealing layer). The first rinse is required to rapidly remove the semiconductor sealing composition, in order to improve the manufacturing efficiency of the semiconductor, and not to contaminate or destroy the circuit materials such as the porous dielectric layer. With the above pH range, in which copper oxide is dissolved but the porous dielectric layer hardly dissolves, the interaction between the porous dielectric layer and the sealing composition material is not greatly impaired.

Namely, the first rinse hardly destroys the porous layer dielectric layer that is formed from silica or the like, and has a function of suppressing exfoliation of the effective sealing composition that seals fine pores of the porous dielectric layer, and rapidly removing the extra sealing composition that has adhered to the wiring material.

Further, since an oxide of the wiring material also exists on the wiring material, in addition to the sealing composition, and causes separation of the wiring material from the low dielectric constant material or separation between the wiring materials. Therefore, it is known that a process of removing the oxide is necessary. The first rinse dissolves an oxide film on the wiring material, specifically a copper oxide film when the wiring material includes copper, and removes the extra sealing composition together with the oxide film. Accordingly, the extra oxide film on the wiring material can be removed together with the extra sealing composition while suppressing exfoliation of the effective sealing composition that seals the fine pores of the porous dielectric layer.

The first rinse preferably contains a solvent having a high polarity. This is because the semiconductor sealing composition according to the invention has a high polarity as described above and easily dissolves in a solvent having a high polarity, thereby improving the rinsing efficiency of the rinse. Specifically, it is preferable that the first rinse contains a polar solvent such as water, methanol, ethanol, propanol, butanol, or propylene glycol monomethyl ether acetate. Such polar solvents do not significantly impair the interaction between the porous dielectric layer and the sealing composition.

The first rinse may be applied with heat or ultrasonic waves.

The first rinse can be produced by adding an acid to the solvent to adjust its pH to be within the above range. The acid that may be used in the present invention is not particularly limited, and an acid that does not contaminate or destroy the porous interlayer dielectric film and is less likely to remain on the semiconductor substrate may be used. Specific examples of the acid include organic acids such as monocarboxylic acids such as formic acid and acetic acid, dicarboxylic acids such as oxalic acid, malonic acid, succinic acid, glutaric acid, adipic acid, pimelic acid, maleic acid, fumaric acid and phthalic acid, tricarboxylic acids such as trimellitic acid and tricarballylic acid, oxymonocarboxylic acids such as hydroxybutyric acid, lactic acid and salicylic acid, oxydicarboxylic acids such as malic acid and tartaric acid, oxytricarboxylic acids such as citric acid, aminocarboxylic acids such as aspartic acid and glutamic acid, p-toluenesulfonic acid, and methanesulfonic acid; and inorganic acids such as hydrochloric acid, nitric acid and phosphoric acid. Among them, at least one selected from the group consisting of oxalic acid, formic acid, citric acid, p-toluenesulfonic acid, methanesulfonic acid, hydrochloric acid and nitric acid is preferable.

From the viewpoint of suppressing oxidization of the wiring material formed by including copper or the like, the first rinse preferably contains a reducing agent or a compound having a deoxidation action. An example of the reducing agent or compound having a deoxidation action that may be used in the first rinse is formalin.

Further, from the viewpoints of preventing cleavage of carbon-carbon bonds or the like in the resin of the sealing composition and preventing exfoliation of the effective sealing layer that seals the fine pores of the porous dielectric layer, the content of the oxidative compound (for example, hydrogen peroxide or nitric acid) in the first rinse is preferably 10% by mass or lower. It is more preferable that the first rinse does not contain an oxidative compound.

Further, the first rinse preferably has an ionic strength of 0.003 or more, more preferably 0.01 or more. Since the semiconductor sealing composition contains a resin that has a cationic functional group and has a high polarity, as described above, the rinse can readily dissolve the resin without significantly impairing the interaction between the porous dielectric layer and the sealing composition, when the pH and the ionic strength are within the above ranges. There is no particular limitation as to the upper limit of the ionic strength, as long as an ionic compound can be dissolved. The ionic strength is expressed by the following formula.

$$\text{Ionic strength} = \frac{1}{2} \times \Sigma(c \times Z^2)$$

(wherein, c represents a molar concentration of the ionic compound included in the rinse, and Z represents an ionic valence of the ionic compound included in the rinse.)

In order to adjust the ionic strength, an ionic compound such as an organic base such as ammonia, pyridine or ethylamine may be added, for example, other than the acid as described above, as necessary.

It is also possible to add a polymer that traps copper ions (for example, polyethyleneimine) after removing copper.

The amounts of the solvent, acid, reducing agent, ionic compound, and the like, which may be incorporated in the first rinse, can be adjusted as appropriate such that the pH and the ionic strength of the rinse each fall within the above ranges.

The first rinse can be prepared by mixing the solvent, acid, reducing agent, ionic compound, and the like. In order to prevent contamination of the semiconductor circuit, it is preferable to prepare the rinse under a clean environment such as in a clean room, or to remove, after the preparation of the rinse, components that may contaminate the semiconductor circuit by means of purification, filtration, or the like.

In the present invention, by the application of the first rinse, the extra sealing composition that has adhered to the wiring material can be rapidly removed by rinsing, while maintaining the effective material that seals the porous interlayer dielectric layer. Further, as described above, an oxide of the wiring material may be removed, whereby separation of the wiring material from the low dielectric constant material or separation between the wiring materials can be suppressed.

The circuit face rinsing process is preferably conducted under a non-oxidizing atmosphere. By conducting rinsing under a non-oxidizing atmosphere, it is possible to prevent excessive removal of copper that is caused by repeated removal of copper oxide on the wiring surface that has existed before rinsing and further oxidization of copper that is to be dissolved with the rinse. A non-oxidizing atmosphere can be created by, for example, using a reducing atmosphere gas.

The method of rinsing the circuit face of the semiconductor substrate according to the invention is not particularly limited, as far as the first rinse is used therein, and rinsing may be conducted by a generally used method.

The time for rinsing the circuit face is not particularly limited. For example, when the rinse has a pH at 25° C. of 5, the rinsing time is preferably from 0.1 minutes to 60 minutes, more preferably from 0.1 minutes to 10 minutes.

<Back Face Rinsing Process>

Hereinafter, a process of rinsing the "back face" of the semiconductor substrate, which is opposite to the face on which the porous interlayer dielectric layer formed, with a rinse is described.

In the sealing composition application process as described above, a semiconductor sealing layer is formed on the surface of the porous interlayer dielectric layer that is disposed on the surface of the semiconductor substrate. During the process, a semiconductor sealing layer may be formed also at peripheral portions of the front face of the semiconductor substrate, where a circuit such as an interlayer dielectric layer is not formed and the semiconductor substrate (when a silicon wafer is used as the semiconductor substrate, a naturally oxidized film formed on the surface of the silicon wafer) is exposed, or at the back face of the semiconductor substrate on which a circuit such as a porous interlayer dielectric film is not formed.

The extra sealing layer that does not seal the porous interlayer dielectric layer may exfoliate during the semiconductor production process such as the wiring forming process as described above, thereby contaminating the semiconductor substrate. Accordingly, it is necessary to provide a rinsing process for removing the extra semiconductor sealing layer after the sealing composition application process, at least for the back face of the semiconductor substrate.

Further, the back face rinsing includes a process of rinsing a portion at an edge portion of the wafer having a round shape that is positioned between the back face and the face on which the porous interlayer dielectric layer is formed (bevel rinsing).

The second rinse according to the invention, which is used in the back face rinsing process, is a liquid that dissolves or decomposes the composition in order to rapidly wash and remove the extra semiconductor sealing composition (semiconductor sealing layer) as described above. It is necessary that the second rinse rapidly removes the semiconductor sealing composition in order to improve the efficiency of producing semiconductors, and that the second rinse does not contaminate or destroy the circuit materials such as the porous dielectric layer.

There are three possible methods for removing the semiconductor sealing composition with the second rinse, which are: 1) weakening the interaction between the semiconductor sealing composition and the semiconductor substrate to which the semiconductor sealing composition is adsorbed; 2) dissolving the semiconductor sealing composition having a high polarity by increasing the ionic strength of the rinse; and 3) decomposing the semiconductor sealing composition. These three methods may be combined with each other.

From the viewpoint of "1)" described above, the second rinse has a pH at 25° C. of 6 or lower, preferably 5 or lower, more preferably from 0 to 2.5, even more preferably from 0 to 2.0. When a silicon wafer is used as the semiconductor substrate, a naturally oxidized film is formed on the back face of the semiconductor substrate, which is to be washed with the rinse, or at the peripheral area of the front face of the semiconductor substrate described below. Therefore, a great number of silanol groups exist at the surfaces. The density of the silanol groups derived from the naturally oxidized film is not limited, but may be generally a density of about 5/100 $Å^2$. It is assumed that the cationic functional group of the semiconductor sealing composition according to the invention forms an interaction with the silanol group and is fixed. Therefore, by rinsing with a rinse having a pH of 5 or lower, or preferably with a rinse having a pH that is equal to or lower than the isoelectric point of the silanol residue, the interaction may be weakened and the extra semiconductor sealing composition may be efficiently removed.

The acid that can be used for adjusting the pH of the second rinse to be within the above range is not particularly limited, as long as it does not contaminate or destroy the porous interlayer dielectric layer and is less likely to remain on the semiconductor substrate. Specific examples of the acid include organic acids such as monocarboxylic acids such as formic acid and acetic acid, dicarboxylic acids such as oxalic acid, malonic acid, succinic acid, glutaric acid, adipic acid, pimelic acid, maleic acid, fumaric acid and phthalic acid, tricarboxylic acids such as trimellitic acid and tricarballylic acid, oxymonocarboxylic acids such as hydroxybutyric acid, lactic acid and salicylic acid, oxydicarboxylic acids such as malic acid and tartaric acid, oxytricarboxylic acids such as citric acid, aminocarboxylic acids such as aspartic acid and glutamic acid, p-toluenesulfonic acid, and methanesulfonic acid; and inorganic acids such as hydrochloric acid, nitric acid and phosphoric acid. Among them, at least one selected from the group consisting of oxalic acid, formic acid, citric acid, p-toluenesulfonic acid, methanesulfonic acid, hydrochloric acid and nitric acid is preferable.

Further, from the viewpoint of "2)" described above, the second rinse preferably has an ionic strength of 0.003 or more, more preferably 0.01 or more. Namely, since the semiconductor sealing composition contains a resin that has a cationic functional group and has a high polarity, as described above, the rinse can readily dissolve the resin without significantly impairing the interaction between the porous dielectric layer and the sealing composition, when the pH and the ionic strength are within the above ranges. There is no particular limitation as to the upper limit of the ionic strength, as long as an ionic compound can be dissolved. The ionic strength is expressed by the following formula.

$$\text{Ionic strength} = \frac{1}{2} \times \Sigma(c \times Z^2)$$

(wherein, c represents a molar concentration of the ionic compound included in the rinse, and Z represents an ionic valence of the ionic compound included in the rinse.)

In order to adjust the ionic strength, an ionic compound such as an organic base such as ammonia, pyridine or ethylamine may be added, for example, other than the organic acid as described above, as necessary.

It is also possible to add a polymer that traps copper ions (for example, polyethyleneimine) after removing copper.

From the viewpoint of "3)" as described above, the second rinse may include a resin decomposer that decomposes the semiconductor sealing composition. The resin decomposer is not particularly limited as far as it is a compound that causes cleavage of carbon-carbon bonds, carbon-nitrogen bonds or carbon-oxygen bonds in the resin, and a conventional decomposer may be used. Specific examples of the resin decomposer include a compound that generates radicals or ions such as $H^+$ or $OH^-$, such as hydrogen peroxide, nitric acid, and a solution containing ozone; and hydrogen peroxide and nitric acid are preferable.

The second rinse satisfies at least one of (A) the pH is 6 or lower, (B) the ionic strength is 0.003 or more, or (C) a resin decomposer is included. The second rinse may satisfy any two of (A) to (C), or may satisfy all of (A) to (C).

The second rinse preferably includes a solvent that has a high polarity and is less likely to destroy a porous layer dielectric layer formed from silica or the like. This is because the semiconductor sealing composition according to the invention has a high polarity as described above, and therefore, the sealing composition readily dissolves in a solvent having a high polarity, thereby improving the rinsing efficiency of the rinse. Specifically, the solvent preferably includes a polar solvent such as water, methanol, ethanol, propanol, butanol, or propylene glycol monomethyl ether acetate.

The second rinse may be applied with heat or ultrasonic waves.

The amounts of the solvent, acid, ionic compound and the like, which may be incorporated in the second rinse, can be adjusted as appropriate such that the pH and the ionic strength of the second rinse each fall within the above ranges.

The second rinse can be prepared by mixing the solvent, acid, oxidant and the like. In order to prevent contamination of the semiconductor circuit, it is preferable to prepare the rinse under a clean environment such as in a clean room, or to remove, after the preparation of the rinse, components that may contaminate the semiconductor circuit by means of purification, filtration, or the like.

The method of rinsing the back face of the semiconductor substrate according to the invention is not particularly limited as far as the second rinse is used, and may be a generally used method. Specifically, rinsing may be conducted by a back rinsing method in the manufacture of a semiconductor, as described in JP-A No. 9-106980.

<Front Face Peripheral Area Rinsing Process>

In the semiconductor device production method of the present invention, the second rinse may be used for rinsing the peripheral area of the front face of the semiconductor substrate (the face on which at least the porous interlayer dielectric layer and the semiconductor sealing layer are formed).

The term "peripheral area" refers to a portion on which a porous interlayer dielectric layer or the like is not formed, which is usually an area of from approximately 1 to 10 mm in width from the edge of the semiconductor substrate. Since a circuit formed on the peripheral area of the semiconductor is difficult to take out by a dicing process or the like, the peripheral area is usually disposed of after the dicing process. For this reason, a porous interlayer dielectric layer is not formed on the surface of the peripheral area, and the semiconductor substrate, which is formed of silicon or a naturally oxidized film of silicon when silicon wafer is used as the semiconductor substrate, is exposed at the peripheral area.

The semiconductor sealing layer formed on a surface of the peripheral area does not exhibit a function of sealing the porous interlayer dielectric layer, as with the case of the semiconductor sealing layer formed on the back face of the semiconductor substrate, and may even cause contamination of the semiconductor circuit. Therefore, the semiconductor sealing layer formed on a surface of the peripheral area is preferably removed by rinsing.

The rinsing of the peripheral area of the front surface of the semiconductor substrate may be conducted by a generally used method of rinsing a peripheral area of the front surface of a semiconductor substrate, provided that the second rinse is used, as with the case of rinsing the back face of the semiconductor substrate as described above. Specifically, rinsing can be conducted by a so-called edge rinsing method in the manufacture of a semiconductor, as described in JP-A No. 9-106980.

The respective rinsing processes as described above may be carried out at the same time, or may be carried out individually.

<Subsequent Wiring Formation Process>

The semiconductor device production method of the present invention may further include, as necessary, processes that are usually performed, such as a wiring formation process similar to that described above, after the sealing composition application process and the rinsing process. For example, a copper wiring is formed by a known metal CVD method, sputtering method, or electroplating method, followed by smoothening the film by CMP.

Subsequently, a cap film is formed on the surface of the film. As necessary, a multilayer wiring semiconductor device may be obtained by forming a hard mask and repeating the sealing composition application process and the circuit face rinsing process.

<Barrier Film (Copper Barrier Layer) Formation Process>

The semiconductor device production method of the invention may include a barrier film (copper barrier layer) formation process, prior to the wiring formation process. By forming a barrier film, diffusion of a metal component into the interlayer dielectric layer may be suppressed more effectively.

The barrier film formation process can be carried out under the generally process conditions. For example, a barrier film may be formed from a titanium compound such as titanium nitride or a tantalum compound such as tantalum nitride, by the vapor phase growth method (CVD), after the semiconductor sealing composition application process. In the present invention, it is preferable to form a barrier film from a tantalum compound.

<Post-Rinsing Process>

The semiconductor device production method of the invention may include a post-rinsing process in which the rinse remaining on the semiconductor substrate is removed, after the circuit face rinsing process or the process of rinsing the back face of the semiconductor substrate. The post-rinsing process can be performed by a generally used method and is not particularly limited. Specifically, the rinsing can be conducted by a post-rinsing method as described in JP-A No. 2008-47831. The rinse used in the post-rinsing process (hereinafter, referred to as a "post-rinse") is not particularly limited as far as it can remove the rinse by dissolving or decomposing the same. Specific examples include a polar organic solvent such as and alcohol, water, a mixture of the polar organic solvent and water, and a solution that includes an acid having degradability such as nitric acid or sulfuric acid, or a solvent that includes ozone.

4. Semiconductor Device

The semiconductor device that is manufactured by the method of the present invention has a structure in which, for example, a porous interlayer dielectric layer, a resin layer that includes a resin having a cationic functional group and a weight average molecular weight of from 2,000 to 600,000 and has a thickness of from 0.3 nm to 5 nm, and a layer formed from copper are positioned in this order. The semiconductor device may include other layers, as necessary. By positioning the resin layer including a specific resin between the interlayer dielectric layer and the wiring material, generation of a leak current or the like can be suppressed and favorable characteristics can be achieved, even if the semiconductor device has a fine circuit of 32 nm or less.

In the present invention, it is preferable that a copper barrier layer (preferably, a layer formed from a tantalum compound) is further disposed between the resin layer and the wiring material including copper.

EXAMPLES

Hereinafter, the present invention is specifically described with reference to the Examples, but the scope of the present invention is not limited thereto.

Manufacturing Example 1

(Formation of Interlayer Dielectric layer)

A silicon wafer was coated with porous silica by dropping 1.0 mL of a composition for forming porous silica onto a surface of the silicon wafer, and then rotating the silicon wafer at 2,000 rpm for 60 seconds. The silicon wafer was then subjected to a heat treatment under a nitrogen atmosphere at 150° C. for 1 minute and at 350° C. for 10 minutes. Thereafter, the resulting substance was heated to 350° C. in a chamber equipped with a 172 nm excimer lamp, and was applied with ultraviolet rays for 10 minutes at a pressure of 1 Pa and an output of 14 mW/cm$^2$. An interlayer dielectric layer (a porous silica film) was thus formed.

The density of the obtained interlayer dielectric layer was 0.887 g/cm$^3$.

Further, the obtained interlayer dielectric layer had a dielectric constant k of 2.0 and an elastic modulus E of 6.60 GPa.

The density was measured in accordance with a conventional method, using an XRD apparatus (TPR-IN-PLANE, manufactured by Rigaku Corporation) under the conditions of an X-ray source of 50 kV and 300 mA, and a wavelength of 1.5418 Å, within the scanning range of from 0° to 1.5°.

The dielectric constant was measured in accordance with a conventional method, using a mercury probe apparatus (SSM5130), under an atmosphere of 25° C. and relative humidity of 30%, at a frequency of 1 MHz.

The elastic modulus was measured in accordance with a conventional method, using a nanoindentater (TRIBO-SCOPE, manufactured by Hysitron), with an indentation depth of 1/10 or less of the film thickness.

(Semiconductor Sealing Composition)

A composition obtained by dissolving 250 mg of polyethyleneimine (PEI, manufactured by BASF Corporation; weight average molecular weight: 25,000, cationic functional group equivalent weight: 309) in 100 mL of water was used as the semiconductor scaling composition. The pH of the semiconductor sealing composition was 10.52. With regard to the semiconductor sealing composition, the volume average particle diameter was measured in accordance with a dynamic light scattering method using ELSZ-2, manufactured by Ootsuka Denshi Co., Ltd. The result was below the detection limit (<10 nm). The measurement was conducted with a cumulative number of 70 and a number of repetition of 1. The analysis was conducted by histogram analysis and cumulant analysis.

The content of sodium and the content of potassium in the semiconductor sealing composition were measured with an ICP mass analyzer. The results were 10 ppb or less on an elemental basis, respectively.

(Formation of Semiconductor Sealing Layer)

The semiconductor sealing composition (PEI aqueous solution) was brought into contact with the interlayer dielectric layer (hereinafter, also referred to as "low-k") by a spraying method (contact time with the solution: 20 seconds, spraying distance: 10 cm) with a commercially available spray bottle "AIR-BOY" (manufactured by Carl Roth GmbH). Subsequently, water was brought into contact by a spraying method (contact time with ultrapure water: 10 seconds, spraying distance: 10 cm) using the same spray bottle. Then, drying was conducted by air blowing, thereby forming a resin layer (semiconductor sealing layer) on the interlayer dielectric layer. Thereafter, the following evaluation was performed with regard to the sample (low-k/PEI) that had been stored in an air-conditioned environment of 23° C. and 55% for at least 15 hours.

The water used herein was ultrapure water (MILLI-Q WATER, manufactured by Millipore Corporation; resistivity of 18 MΩ·cm or less (at 25° C.)).

[Composition and Formation of Semiconductor Sealing Layer]

The element composition of the semiconductor sealing layer of the obtained sample (low-k/PEI) was measured with ESCALAB 220iXL (manufactured by VG) as an X-ray photoelectron spectrometry (XPS) apparatus, under the conditions of an X-ray source of AlKα and an analysis region of φ1 mm. The composition that had increased as compared with the interlayer dielectric layer (low-k) obtained as described above was C/N=2.34. From this result, it was confirmed that a polyethyleneimine layer was formed.

The formation of the surface of the semiconductor sealing layer was observed using an atomic force microscope, and it was found that the RMS was 0.369 nm (the interlayer dielectric layer alone: 0.403 nm), and it was found that a layer having a uniform thickness was formed.

Further, the cross section of Sample 1 (low-k/PEI/Cu) obtained as described above was observed in a manner substantially similar to that described above, and element mapping was carried out. From the distribution state of nitrogen atoms derived from polyethyleneimine, the thickness of the resin layer was estimated to be 5 nm or less.

[Evaluation of Sealability]

A metal copper film was formed by sputtering on the semiconductor sealing layer of the obtained sample (low-k/PEI), thereby preparing Sample 1 (hereinafter, also referred to as "low-k/PEI/Cu".)

The obtained Sample 1 (low-k/PEI/Cu) was visually observed, and it was confirmed that a metal film having a metal copper color was formed on the semiconductor sealing layer.

The sputtering was conducted with HSM-521 (manufactured by Shimadzu Corporation) under the conditions of a preset current of 0.4 A, a preset voltage of 440 V, under an Ar atmosphere, and a sputtering time of 2 minutes and 10 seconds.

The film thickness of the metal film of Sample 1 (low-k/PEI/Cu) was measured with a profilometer, DEKTAK3 (VERSION 3.22b FP/J, manufactured by Veeco Metrology Group). The result was 50 nm to 100 nm.

Next, a cross section sample of Sample 1 (low-k/PEI/Cu) was prepared using, as a focused ion beam (FIB) system, SMI2050 (manufactured by Seiko Instruments Inc.) The cross section of the sample, in which a metal copper film was formed on the semiconductor sealing layer, was observed with a conventional transmission electron microscope, JEM-2200FS (manufactured by JEOL Ltd.; accelerating voltage: 220 kV) and the diffusion depth of a metal component was measured. It was found that the diffusion depth of the metal component was 0 nm, and it was confirmed that diffusion of the metal component into the porous interlayer dielectric layer was suppressed by the semiconductor sealing layer.

Example 1-1

(Preparation of Rinse 1-1)

Rinse 1-1 was prepared by gradually adding oxalic acid dihydride (manufactured by JUNSEI CHEMICAL CO., LTD.; special grade) to ultrapure water (MILLI-Q WATER, manufactured by Millipore Corporation) while measuring the pH with a pH meter, and the pH was adjusted to 3 at 25° C.

(Application of Sealing Composition)

A copper layer having a thickness of 50 nm was formed as a wiring material on a surface of a silicon wafer (manufactured by Furuuchi Chemical Corporation; 8 inch, {100} face, P-type, (boron doped), 10 to 20 ohm-cm, thickness: 700 to 775 μm) having an interlayer dielectric layer on its surface, with a vacuum vapor deposition apparatus manufactured by Showa Shinku Co., Ltd. (SGC-8) at a deposition rate of 2 nm/sec for 25 seconds. A circuit face provided with a porous interlayer dielectric layer and a wiring material including copper was formed on one surface of a silicon wafer.

The silicon wafer having the circuit face formed thereon was allowed to stand in air for at least 2 hours, and a naturally oxidized film (copper oxide) was formed on the surface of the wiring. Then, a portion having a wire on its surface was cut into a size of 5 mm square and the surface was subjected to UV-O3 treatment for 5 minutes. Onto this, 2 mL of the semiconductor sealing composition (polyethyleneimine aqueous solution) of the manufacturing example 1 was applied by dropping and spin casting at 600 rpm, thereby forming a semiconductor sealing layer. Substrate 1 that includes a sealing layer/a copper layer/a silicon layer was thus prepared.

(Rinsing of Circuit Face)

Next, the substrate 1 was immersed in the rinse 1 that fills a container having a volume of 20 mL to a depth of 15 mm, and the container was placed on a shaker and maintained for 60 minutes. Then, the container was emptied and the substrate 1 was rinsed three times with ultrapure water. Subsequently, the substrate 1 was immersed in ultrapure water that fills a container having a volume of 20 mL to a depth of 15 mm, and the container was placed on a shaker and maintained for 15 minutes. The substrate 1 was taken out of the container with a pair of tweezers, rinsed for 1 minute with an ultrapure water wash bottle, and dried by dry air blowing.

(Evaluation of Wire Rinsing)

With regard to the obtained sample, the element composition was measured with ESCALAB 220iXL (manufactured by VG) as an XPS apparatus under the conditions of an X-ray source of AlKα and an analysis region of φ1 min. Further, the sample was visually observed in order to evaluate the wire rinsing. The element composition of the sample prior to be washed with the rinse 1-1 was also measured in the same manner.

The amount (atom %) of nitrogen atoms, which represents the amount of polyethyleneimine included in the semiconductor sealing layer formed on the substrate 1 before the evaluation of wire rinsing was 8.9 atom %. However, after the evaluation of wire rinsing, the color of copper oxide that appeared before rinsing was not recognized at all by visual observation. Thus, it was confirmed that the rinse 1 exhibited an excellent rinsing property with respect to the extra semiconductor sealing layer on the wire.

(Evaluation of Rinse Resistance)

In order to evaluate the rinse resistance of the sealing layer on the porous interlayer dielectric layer, a silicon wafer (manufactured by Furuuchi Chemical Corporation; 8 inch, {100} face, P-type, (boron doped), 10 to 20 ohm-cm, thickness: 700 to 775 μm) was allowed to stand in air for at least 24 hours, thereby forming a naturally oxidized film on the surface. The resultant was cut into a size of 5 mm square and the surface thereof was subjected to UV-O3 treatment for 5 minutes. Onto this, 2 mL of the semiconductor sealing composition (aqueous solution of polyethyleneimine) was applied by dropping and spin casting at 600 rpm, whereby substrate 2 was prepared. The surface of the substrate 2 had a surface state of porous silica, which is a kind of porous low-dielectric constant material.

Next, the substrate 2 was immersed in the rinse 1-1 that fills a container having a volume of 20 mL to a depth of 15 mm, and the container was placed on a shaker and maintained for 60 minutes. Then, the container was emptied and the substrate 2 was rinsed three times with ultrapure water. Subsequently, the substrate 2 was immersed in ultrapure water that fills a container having a volume of 20 mL to a depth of 15 mm, and the container was placed on a shaker and maintained for 15 minutes. The substrate 2 was taken out of the container with a pair of tweezers, rinsed for 1 minute with an ultrapure water wash bottle, and dried by dry air blowing. The element composition was measured with ESCALAB 220iXL (manufactured by VG) as an XPS apparatus under the conditions of an X-ray source of AlKα and an analysis region of φ1 mm, and the rinse resistance was evaluated.

The amount (atom %) of nitrogen atoms, which represents the amount of polyethyleneimine included in the semiconductor sealing layer on the substrate 2, was 9.3 atom % before the evaluation of rinse resistance. However, after the evaluation of rinse resistance, the amount was maintained to be 5.4 atom %. Thus, it was confirmed that the semiconductor sealing layer on the porous low-dielectric constant material exhibited a favorable rinse resistance with respect to the rinse 1-1.

Example 1-2

(Preparation of Rinse 1-2)

Rinse 2 was obtained by gradually adding oxalic acid dihydride (manufactured by JUNSEI CHEMICAL CO., LTD.; special grade) to pure water (MILLI-Q WATER, manufactured by Millipore Corporation) while measuring the pH with a pH meter to adjust the pH to 5 at 25° C.

Substrate 1 and substrate 2 were prepared and evaluation of wire rinsing and evaluation of rinse resistance were conducted, in a manner substantially similar to that in Example 1-1, except that the rinse 1-2 was used instead of the rinse 1-1.

The amount (atom %) of nitrogen atoms, which represents the amount of polyethyleneimine included in the semiconductor sealing layer on the substrate 1, before the evaluation of wire rinsing was 8.9 atom %. However, after the evaluation of wire rinsing, the color of copper oxide that appeared before the rinsing was not recognized at all by visual observation. Thus, it was confirmed that the rinse 1-2 exhibited an excellent rinsing property with respect to the extra semiconductor sealing layer on the wire.

Further, the amount (atom %) of nitrogen atoms, which represents the amount of polyethyleneimine included in the semiconductor sealing layer on the substrate 2, before the evaluation of rinse resistance was 9.3 atom %. However, after the evaluation of rinse resistance, the amount was maintained to be 5.5 atom %. Thus, it was confirmed that the semiconductor sealing layer on the porous low-dielectric constant material exhibited a favorable rinse resistance with respect to the rinse 1-2.

Comparative Example 1-1

(Preparation of Rinse 1-3)

Rinse 1-3 was obtained by gradually adding 0.5 N aqueous ammonia to pure water (MILLI-Q WATER, manufactured by Millipore Corporation) while measuring the pH with a pH meter to adjust the pH to 7 at 25° C.

Substrate 1 and substrate 2 were prepared, and evaluation of wire rinsing and evaluation of rinse resistance were conducted in a manner substantially similar to Example 1-1, except that the rinse 1-3 was used instead of the rinse 1-1.

The amount (atom %) of nitrogen atoms, which represents the amount of polyethyleneimine included in the semiconductor sealing layer on the substrate 1, before the evaluation of wire rinsing was 8.9 atom %. After the evaluation of wire rinsing, the amount was decreased only to the amount of 4.7 atom %. Thus, it was confirmed that the rinsing property of the rinse 1-3 with respect to the extra semiconductor sealing layer on the wire was insufficient.

Further, the amount (atom %) of nitrogen atoms, which represents the amount of polyethyleneimine included in the semiconductor sealing layer on the substrate 2, before the evaluation of rinse resistance was 9.3 atom %. However, after the evaluation of rinse resistance, the amount was decreased to 4.7 atom %. Thus, it was confirmed that the rinse resistance of the semiconductor sealing layer on the porous low-dielectric constant material, with respect to the rinse 1-3, was insufficient.

Comparative Example 1-2

(Preparation of Rinse 1-4)

Rinse 1-4 was obtained by gradually adding 0.5 N aqueous ammonia to pure water (MILLI-Q WATER, manufactured by Millipore Corporation) while measuring the pH with a pH meter to adjust the pH to 9 at 25° C.

Substrate 1 and substrate 2 were prepared, and evaluation of wire rinsing and evaluation of rinse resistance were conducted in a manner substantially similar to Example 1-1, except that the rinse 1-4 was used instead of the rinse 1-1.

The amount (atom %) of nitrogen atoms, which represents the amount of polyethyleneimine included in the semiconductor sealing layer on the substrate 1, before the evaluation of wire rinsing was 8.9 atom %. After the evaluation of wire rinsing, the amount was decreased only to 6.6 atom %. Thus, it was confirmed that the rinsing property of the rinse 1-4, with respect to the extra semiconductor sealing layer on the wire, was insufficient.

Further, the amount (atom %) of nitrogen atoms, which represents the amount of polyethyleneimine included in the semiconductor sealing layer on the substrate 2, before the evaluation of rinse resistance was 9.3 atom %. However, after the evaluation of rinse resistance, the amount was decreased to 3.9 atom %. Thus, it was confirmed that the rinse resistance of the semiconductor sealing layer on the porous low-dielectric constant material, with respect to the rinse 1-4, was insufficient.

Comparative Example 1-3

(Preparation of Rinse 1-5)

Rinse 1-5 was obtained by gradually adding 0.5 N aqueous ammonia to pure water (MILLI-Q WATER, manufactured by Millipore Corporation) while measuring the pH with a pH meter to adjust the pH to 10.5 at 25° C.

Substrate 1 and the substrate 2 were prepared, and evaluation of wire rinsing and evaluation of rinse resistance were conducted in a manner substantially similar to Example 1-1, except that the rinse 1-5 was used instead of the rinse 1-1.

The amount (atom %) of nitrogen atoms, which represents the amount of polyethyleneimine included in the semiconductor sealing layer on the substrate 1, before the evaluation of wire rinsing was 8.9 tom%. After the evaluation of wire rinsing, the amount remained to be 8.9 atom %. Thus, it was confirmed that the rinsing property of the rinse 1-5, with respect to the extra semiconductor sealing layer on the wire, was insufficient.

Further, the amount (atom %) of nitrogen atoms, which represents the amount of polyethyleneimine included in the semiconductor sealing layer on the substrate 2, before the evaluation of rinse resistance was 9.3 atom %. After the evaluation of rinse resistance, the amount remained to be 9.3 atom %.

Example 2-1

(Synthesis of Rinse 2-1)
A 30% aqueous solution of hydrogen peroxide (manufactured by JUNSEI CHEMICAL CO., LTD.; special grade) was used as rinse 2-1. The pH of the rinse 2-1 was 4.5 at 25° C.

(Preparation of Semiconductor Substrate)
In order to evaluate the back face rinsing and edge rinsing, a silicon wafer (manufactured by Furuuchi Chemical Corporation; 8 inch, {100} face, P-type, (boron doped), 10 to 20 ohm-cm, thickness: 700 to 775 μm) was allowed to stand in air for at least 24 hours, thereby forming a naturally oxidized film on the surface. Then, the substrate was cut into a size of 5 mm square and the surface thereof was subjected to UV-O3 treatment for 5 minutes. Onto this, 2 mL of the semiconductor sealing composition (aqueous solution of polyethyleneimine) was applied by dropping and spin casting at 600 rpm, thereby forming a semiconductor sealing phase. A silicon wafer was thus prepared.

(Evaluation of EBR Characteristics)
Next, the silicon wafer prepared above was immersed in the rinse 2-1 in a container having a volume of 20 mL to a depth of 15 mm, and the container was placed on a shaker and maintained for 60 minutes. Then, the container was emptied and the silicon wafer was rinsed three times with ultrapure water. Subsequently, the silicon wafer was immersed in ultrapure water that fills a container having a volume of 20 mL to a depth of 15 mm, and the container was placed on a shaker and maintained for 15 minutes. The silicon wafer was taken out of the container with a pair of tweezers, rinsed for 1 minute with an ultrapure water wash bottle, and dried by dry air blowing. The element composition was measured with ESCALAB 220iXL (manufactured by VG) as an XPS apparatus under the conditions of an X-ray source of AlKα and an analysis region of φ1 mm, and the E (edge) B (back or bevel) R (rinse) characteristics were evaluated.

The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased to 1.3 atom %. Thus, it was confirmed that the rinse 2-1 exhibited a favorable rinsing property with respect to the semiconductor sealing layer.

Example 2-2

(Synthesis of Rinse 2-2)
Rinse 2-2 having an ionic strength of 0.005 was obtained by adding oxalic acid dihydride (manufactured by JUNSEI CHEMICAL CO., LTD.; special grade) to ultrapure water, while measuring the pH with a pH meter to adjust to 2.0±0.05 at 25° C.

Preparation of a semiconductor substrate and evaluation of EBR characteristics were conducted in a manner substantially similar to Example 2-1, except that the rinse 2-2 was used instead of the rinse 2-1. The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased to 2.1 atom %. Thus, it was confirmed that the rinse 2-2 exhibited a favorable rinsing property with respect to the semiconductor sealing layer.

Example 2-3

(Synthesis of Rinse 2-3)
Rinse 2-3 having an ionic strength of 0.0039 was obtained by adding hydrochloric acid to ultrapure water, while measuring the pH with a pH meter to adjust to 2.0±0.05 at 25° C.

Preparation of a semiconductor substrate and evaluation of EBR characteristics were conducted in a manner substantially similar to Example 2-1, except that the rinse 2-3 was used instead of the rinse 2-1. The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased to 3.73 atom %. Thus, it was confirmed that the rinse 2-2 exhibited a favorable rinsing property with respect to the semiconductor sealing layer.

Example 2-4

(Synthesis of Rinse 2-4)
Rinse 2-4 having an ionic strength of 0.0055 was obtained by adding methanesulfonic acid to ultrapure water, while measuring the pH with a pH meter to adjust to 2.0±0.05 at 25° C.

Preparation of a semiconductor substrate and evaluation of EBR characteristics were conducted in a manner substantially similar to Example 2-1, except that the rinse 2-4 was used instead of the rinse 2-1. The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased to 1.77 atom %. Thus, it was confirmed that the rinse 2-4 exhibited a favorable rinsing property with respect to the semiconductor sealing layer.

Example 2-5

(Synthesis of Rinse 2-5)
Rinse 2-5 having an ionic strength of 0.0071 was obtained by adding nitric acid to ultrapure water while measuring the pH with a pH meter to adjust to 2.0±0.05 at 25° C.

Preparation of a semiconductor substrate and evaluation of EBR characteristics were conducted in a manner substantially similar to Example 2-1, except that the rinse 2-5 was used instead of the rinse 2-1. The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased to 3.44 atom %. Thus, it was confirmed that the rinse 2-5 exhibited a favorable rinsing property with respect to the semiconductor sealing layer.

Comparative Example 2-1

(Synthesis of Rinse 2-6)

Ultrapure water was used as rinse 2-6. The pH of the rinse 2-6 was from 6.5 to 7.0 at 25° C., and the ionic strength was 0.

Preparation of a semiconductor substrate and evaluation of EBR characteristics were conducted in a manner substantially similar to that in Example 2-1, except that the rinse 2-6 was used instead of the rinse 2-1. The amount (atom %) of nitrogen atoms, which represents the amount of polyethyleneimine included in the semiconductor sealing layer on the semiconductor substrate, before the evaluation of EBR was 8 atom %. However, after the evaluation of EBR, the amount was decreased only to 5.9 atom %. Thus, it was confirmed that the rinse 2-6 did not exhibit a favorable rinsing property with respect to the semiconductor sealing layer.

The invention claimed is:

1. A semiconductor device production method, the method comprising:
    a sealing composition application process in which a semiconductor sealing layer is formed by applying, to at least a portion of a surface of a semiconductor substrate, a semiconductor sealing composition that includes a resin having a cationic functional group and a weight average molecular weight of from 2,000 to 600,000, wherein a content of sodium and a content of potassium are 10 mass ppb or less on an elemental basis, respectively; and, subsequently,
    a rinsing process in which the surface of the semiconductor substrate on which the semiconductor sealing layer has been formed is rinsed with a rinse having a pH at 25° C. of 6 or lower,
    wherein the resin having a cationic functional group is selected from the group consisting of polyethyleneimine, polyallylamine, polydiallyldimethylammonium, polyvinylpyridine, polylysine, polymethylpyridylvinyl, protonated poly(p-pyridyl vinylene), and derivatives thereof.

2. The semiconductor device production method according to claim 1, wherein the resin having a cationic functional group and a weight average molecular weight of from 2,000 to 600,000 has a cationic functional group equivalent amount of from 43 to 430.

3. The semiconductor device production method according to claim 1, wherein the resin having a cationic functional group and a weight average molecular weight of from 2,000 to 600,000 is polyethyleneimine or a polyethyleneimine derivative.

4. The semiconductor device production method according to claim 1, wherein a porous interlayer dielectric layer is formed on at least a portion of the surface of the semiconductor substrate.

5. The semiconductor device production method according to claim 4, wherein the semiconductor sealing layer is formed on the porous interlayer dielectric layer, the porous interlayer dielectric layer has a concave groove having a width of from 10 nm to 32 nm, and the sealing composition application process includes contacting the semiconductor sealing composition to at least a side face of the concave groove of the porous interlayer dielectric layer.

6. The semiconductor device production method according to claim 4, wherein the porous interlayer dielectric layer contains porous silica, and has a silanol residue derived from the porous silica on a surface of the porous interlayer dielectric layer.

7. The semiconductor device production method according to claim 1, wherein the rinse includes at least one solvent selected from the group consisting of water, methanol, ethanol, propanol, butanol and propylene glycol monomethyl ether acetate.

8. The semiconductor device production method according to claim 1, wherein the rinse includes at least one acid selected from the group consisting of oxalic acid, formic acid, citric acid, p-toluenesulfonic acid, methanesulfonic acid, hydrochloric acid and nitric acid.

9. The semiconductor device production method according to claim 1, wherein the surface of the semiconductor substrate on which the semiconductor sealing layer has been formed comprises a surface on which a semiconductor circuit is not formed.

10. The semiconductor device production method according to claim 9, wherein the rinse, with which the surface on which a semiconductor circuit is not formed is rinsed, has a pH at 25° C. of 2 or lower.

11. The semiconductor device production method according to claim 1, wherein at least a portion of the surface of the semiconductor substrate comprises a circuit face that is provided with a porous interlayer dielectric layer and a wiring material that includes copper, and the rinsing process is a circuit face rinsing process in which the sealing layer on the wiring material is removed.

12. The semiconductor device production method according to claim 11, wherein the rinse with which the semiconductor circuit face is rinsed has a pH at 25° C. of 1 or higher.

* * * * *

UNITED STATES PATENT AND TRADEMARK OFFICE
CERTIFICATE OF CORRECTION

PATENT NO. : 8,956,977 B2
APPLICATION NO. : 13/818347
DATED : February 17, 2015
INVENTOR(S) : Shoko Ono et al.

It is certified that error appears in the above-identified patent and that said Letters Patent is hereby corrected as shown below:

Title Page, item (73) Assignee: change "Mitsu Chemicals, Inc." to --Mitsui Chemicals, Inc.--

Signed and Sealed this
Twenty-first Day of July, 2015

Michelle K. Lee
*Director of the United States Patent and Trademark Office*